United States Patent [19]

Gorin et al.

[11] 4,264,393
[45] Apr. 28, 1981

[54] REACTOR APPARATUS FOR PLASMA ETCHING OR DEPOSITION

[75] Inventors: Georges J. Gorin, Emeryville; Paul C. Lindsey, Jr., Lafayette, both of Calif.

[73] Assignee: Motorola, Inc., Schaumburg, Ill.

[21] Appl. No.: 847,349

[22] Filed: Oct. 31, 1977

[51] Int. Cl.³ .................. B44C 1/22; C03C 15/00; C03C 25/06
[52] U.S. Cl. .................. 156/345; 118/620; 118/728; 156/643; 204/192 E; 204/298; 250/531
[58] Field of Search .......... 156/643, 646, 345; 250/531; 204/164, 192 E, 298, 192 CE; 118/49.1, 49.5, 715, 728, 620, 625; 427/39

[56] References Cited

U.S. PATENT DOCUMENTS

| | | | |
|---|---|---|---|
| 3,369,989 | 2/1968 | Kay et al. | 204/298 UX |
| 3,477,936 | 11/1969 | Gillery et al. | 204/164 X |
| 3,654,108 | 4/1972 | Smith | 250/544 X |
| 3,733,258 | 5/1973 | Hanak et al. | 204/298 X |
| 3,971,684 | 7/1976 | Muto | 252/79.1 X |
| 3,984,301 | 10/1976 | Matsuzaki et al. | 204/192 |
| 4,066,037 | 1/1978 | Jacob | 118/49.1 |
| 4,148,705 | 4/1979 | Battey et al. | 204/192 E |

FOREIGN PATENT DOCUMENTS 2601288  7/1976  Fed. Rep. of Germany ........... 156/646

Primary Examiner—William A. Powell
Attorney, Agent, or Firm—John A. Fisher

[57] ABSTRACT

Plasma reactor apparatus which provides improved uniformity of etching or deposition. A uniform radio frequency (RF) field is established between two closely spaced parallel plates disposed within the reactor. One of the plates functions as a manifold for the reactant gases, mixing the gases and dispensing them through a regular array of orifices into the RF field between the plates. The uniformity results from a combination of the uniform field, the uniform dispersion of reactant gases, and the close proximity of the gas dispersal to the work pieces. The capacity of the apparatus can be increased by repeating the parallel plate structure in a stacked array of alternating grounded and RF energized plates.

5 Claims, 2 Drawing Figures

REACTOR APPARATUS FOR PLASMA ETCHING OR DEPOSITION

BACKGROUND OF THE INVENTION

This invention relates to an improved apparatus which can be generally utilized for plasma processing, or more specifically for either plasma etching and cleaning or for plasma deposition. In particular, this invention relates to an apparatus which provides an improved uniformity of etch rate and an improved uniformity of deposition rate across the entire surface of the work piece.

The plasma chemistry technique provides a new approach to industrial materials processing in a variety of applications. It eliminates the need for high temperatures or wet chemicals in the etching or other preparation of small electronic, optical, and mechanical parts. In the plasma chemistry technique, the material or specimen is placed in or on a sample holder which is loaded into the reaction chamber of the apparatus. The chamber is evacuated to a mild vacuum by a mechanical vacuum pump and the reaction gases are drawn into the chamber to surround the sample. Radio frequency power is applied to the chamber to excite the reaction gas molecules and to change some of them to other species, such as atoms, radicals, ions, and free electrons. This gaseous plasma is highly reactive and it causes a low temperature reaction of the species in the gas or on the surface of the specimen. The waste products of the reaction are carried away in the gas stream, leaving the base specimen material for further processing. By using different gases, highly selective reactions with a sample can be obtained. In order to etch the sample, for example, the gas can be selected from a number of either oxidizing or reducing gases. If it is desired, instead, to deposit a film upon the specimen, a reaction gas could be selected which is a source of the film material. For example, to deposit a film of silicon nitride, the reaction gas could be a mixture of silane, ammonia, and nitrogen. To deposit silicon, the reaction gas could be silane, a halosilane, or a silicon halide.

Among the plasma reactors known in the prior art are the so-called radial flow reactors. In these reactors, which are specifically designed for plasma deposition, an annular electrode forms the support for the material specimens which are disposed around the circumference on a surface of the support. Gas flow is established over the outer edge of the support and flows in a laminar manner radially over the specimen and is exhausted through an exhaust port located in the center of the support. As the gas flows in this radial manner a glow discharge is effected by an RF field established between the support and the second parallel electrode positioned above the specimens. The most serious deficiency of this apparatus is the lack of uniformity of the thickness of the deposit along a radius because of source gas depletion effects.

Cylindrical reactors are also known and used in the prior art. As the gas passes through the reactor, it is ionized by the high frequency electromagnetic field established around the reactor. These reactors are principally used for etching or cleaning, but could also be used for deposition by a proper selection of the reactant gas. Like the aforementioned radial flow reactor, the cylindrical reactor also suffers from non-uniformities. Again, the non-uniformity is due in part to source gas depletion as the reaction gas flows through the reactor.

In general, because the plasma consists of a neutral cloud of electrically charged particles, there is a finite probability that two charged particles can recombine to form a neutral and unreactive molecule. This effect, of course, increases with both time and distance traveled by the ionized species. Thus the density of the reactant species will vary as a function of the distance away from the inlet orifice through which the reactant gas enters the chamber. This results in a uniformity problem which exists with either of the aforementioned reactors. This problem is more critical with some gases than with others because of different reactive lifetimes. For gases having short reactive lifetimes, it is commonplace to use high vacuum pumping rates to move the gases quickly through the reactor and thereby minimize depletion effects. The high pumping rates require large, expensive pumps and are wasteful of reaction gases as quantities of unreacted gases are expelled from the reactor.

In certain applications, such as the fabrication of semiconductor devices, the coating of optical lenses, or the fabrication of precision mechanical parts, extreme uniformity is required, both across a single work piece and from one work piece to another. Accordingly, a need has existed for a plasma reactor design which affords the high precision and uniformity necessary for these and similar applications.

SUMMARY OF THE INVENTION

It is an object of this invention to provide a plasma reactor capable of either etching or cleaning a work piece or a portion thereof or depositing a thin film layer on the work piece.

It is a further object of this invention to provide a plasma reactor for etching or coating which accomplishes this function with high precision and uniformity.

It is a still further object of this invention to provide a plasma reactor which has a high throughput of materials.

The attainment of these and related objects and advantages may be achieved through the use of the novel plasma reactor herein disclosed.

In one embodiment of the invention the reactor comprises an enclosure within which are disposed two closely spaced parallel plates. These plates perform a multiplicity of functions. One plate is grounded and the other is connected to a radio frequency (RF) power source so that a uniform RF field can be created between the plates. The reactor requires no additional internal electrodes to perform the described function. The grounded bottom plate serves as a support for the work pieces which are to be acted upon for either etching or coating. This bottom plate can also enclose heating or cooling elements for maintaining the work pieces at a desired temperature. The work pieces are placed flat upon this grounded plate so as to be within a uniform RF field. The top plate also functions as a dispersing manifold for the reactant gases. The reactant gases, selected for the particular etching or deposition function desired, are fed into the hollow top plate. The mixing of gases, if necessary, can take place within the hollow plate. The bottom surface of the top plate is provided with an array of orifices through which the gases are dispersed into the RF field. The gases are excited by the RF field and the resulting plasma reacts in the desired manner with the work pieces. The uniformity of etching or coating results from a combination of the uniform field, the uniform dispersion of reactant gases, and the close proximity of the gas dispersal means to the work pieces.

In a further embodiment of the invention, the capacity of the apparatus and thus the throughput are increased by repeating the above described structure in a stacked array of alternating grounded and RF energized plates.

In either of these embodiments the work pieces can be arrayed on a supporting sheet which slides into the enclosure and rests upon the grounded plate. Alternatively, the grounded plates themselves can be removable and can function directly as the work piece holder. Thus, a grounded plate can be unplugged and removed from the apparatus to facilitate loading of the work pieces directly upon the plate.

The particular elements of the invention and the benefits to be derived therefrom will be more readily apparent after review of the following more detailed description of the invention taken in connection with the drawings.

DETAILED DESCRIPTION OF PREFERRED EMBODIMENTS

Figure 1:
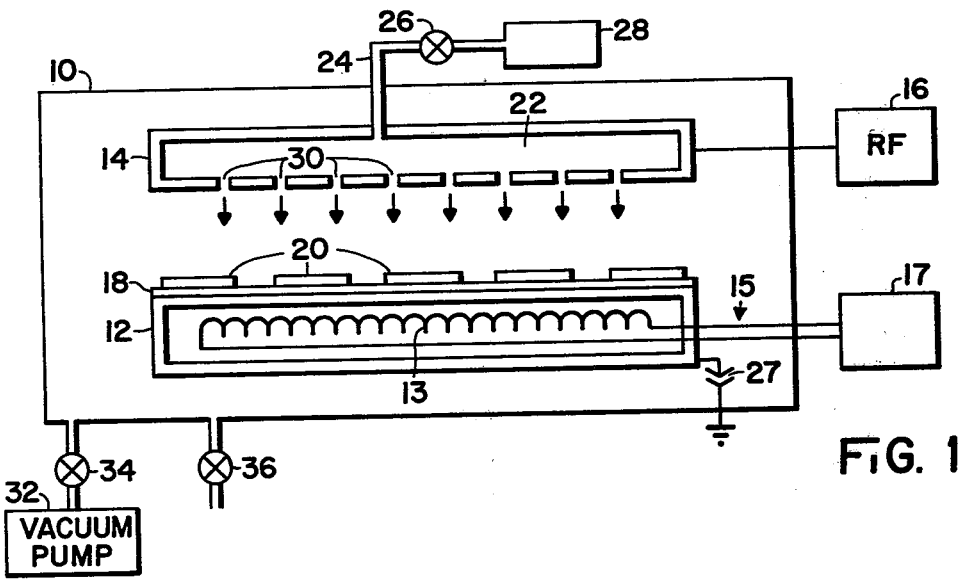
FIG. 1 is a partially schematic cross-sectional view showing one embodiment of the plasma reactor apparatus.

In FIG. 1 a reactor enclosure 10 is shown within which the ambient can be controlled. Disposed within the enclosure 10 are two metallic plates 12, 14 which are arranged parallel to each other and separated by a small distance. The lower plate 12 is electrically grounded. The upper plate 14 is connected to a source of RF energy 16 which can be any conventional RF generator. The two plates 12, 14 can thus form part of the RF generator circuit. A sheet or holder 18 is provided to hold the work pieces 20 which could be, for example, semiconductor wafers. The work pieces 20 could also be, for example, lenses, precision mechanical parts, or the like. The plates 12, 14 are metallic and can be made, for example, of aluminum or other suitable metal. The spacing between the plates can be from about one-half inch to about two inches. The area of the plates 12, 14 is somewhat arbitrary and can be made as large as necessary to accommodate the required size of the work piece or the desired number of smaller work pieces. The length and width of the plates 12, 14 should be large compared to the spacing between the plates to assure a uniform RF electric field over most of the area of the plates. A plate size of twelve inches by twelve inches has been found to be satisfactory but the ultimate size is a matter of design choice to accomplish the specific task. The upper plate 14 is hollowed out to form a cavity 22. Obviously it would also be possible to form the cavity, for example, by laminating together several sheets of material. The cavity 22 is connected to a source of reactant gas 28 by tubing 24 and pressure and flow controls 26. In actual practice, there may be a plurality of sources 28 to provide a number of different gases, but only one source has been shown for clarity. If more than one gas is needed in the reaction, the mixing of these gases can take place in the cavity 22 or prior to entrance into the cavity. Once the gases are mixed, they are dispersed from the cavity 22 through orifices 30.

Thus, the plate 14 forms one element of the RF generator circuit while additionally serving as a gas manifold. The orifices 30 can be a regular rectangular array of holes formed in the bottom of the upper plate 14. The holes can be spaced at about one-half inch intervals in both length and width dimension. Such a regular array of orifices helps to insure a uniform distribution of gases throughout the space between the two parallel plates 12, 14 and around each of the work pieces 20.

The lower plate 12 can be provided with temperature control elements 13. These elements 13 could be, for example, a resistance heating coil for raising the temperature, or water cooled tubing for lowering the temperature. In either case the temperature control element 13 can be electrically isolated from the RF field. Feed throughs 15 can be brought outside the enclosure 10 and can be connected, appropriately, to a source 17 of electrical power or cooling liquid.

In a typical operation, the work pieces 20, which, for example, might be semiconductor wafers, are loaded on the holder 18 and are placed in the enclosure 10. Alternatively, the lower plate 12 could be made removable, and the wafers could be loaded directly onto that plate, in which case the plate 12 would be placed in the enclosure and plugged into an electrical ground connection as shown schematically at 27. Because of the close spacing between the plates, the work pieces are in close proximity to the gas dispersing orifices. With the work pieces loaded into the enclosure, the enclosure 10 is evacuated by a vacuum pump 32 through a control valve 34. If desired, the enclosure could then be backfilled with a carrier gas through a valve 36. An RF field in then established between the parallel plates and the reactant gas is introduced into the hollow cavity 22. The particular reactant gas is selected depending upon the operation to be performed. For example, if the work pieces are semiconductor wafers with a silicon nitride layer and it is desired to etch that layer, then the reaction gas selected might be carbon tetrafluoride. If, instead, it is desired to deposit a layer of silicon nitride on the wafer, then the reactant gases might be silane, nitrogen, and ammonia. In the latter example, these gases could be introduced separately and mixed in the cavity 22 or they could be premixed and introduced into cavity 22 as a mixture.

Assume that a nitride layer is to be etched in carbon tetrafluoride. The carbon tetrafluoride is injected into the space between the parallel plates through the orifices 30 where it is then excited by the RF field to form a plasma. Because the field and the gas distribution are uniform, a uniform plasma is formed throughout the space between the plates 12, 14. This results in uniform etching of the nitride, both across a single wafer and from wafer to wafer. The plasma reacts with the silicon nitride to form gaseous reaction products which can then be evacuated from the enclosure by the vacuum pump 32 or can be flushed out by means of a gas entering through the control valve 36. During the reaction, the temperature control elements 13 can be used to help control the temperature of the wafers.

Figure 2:
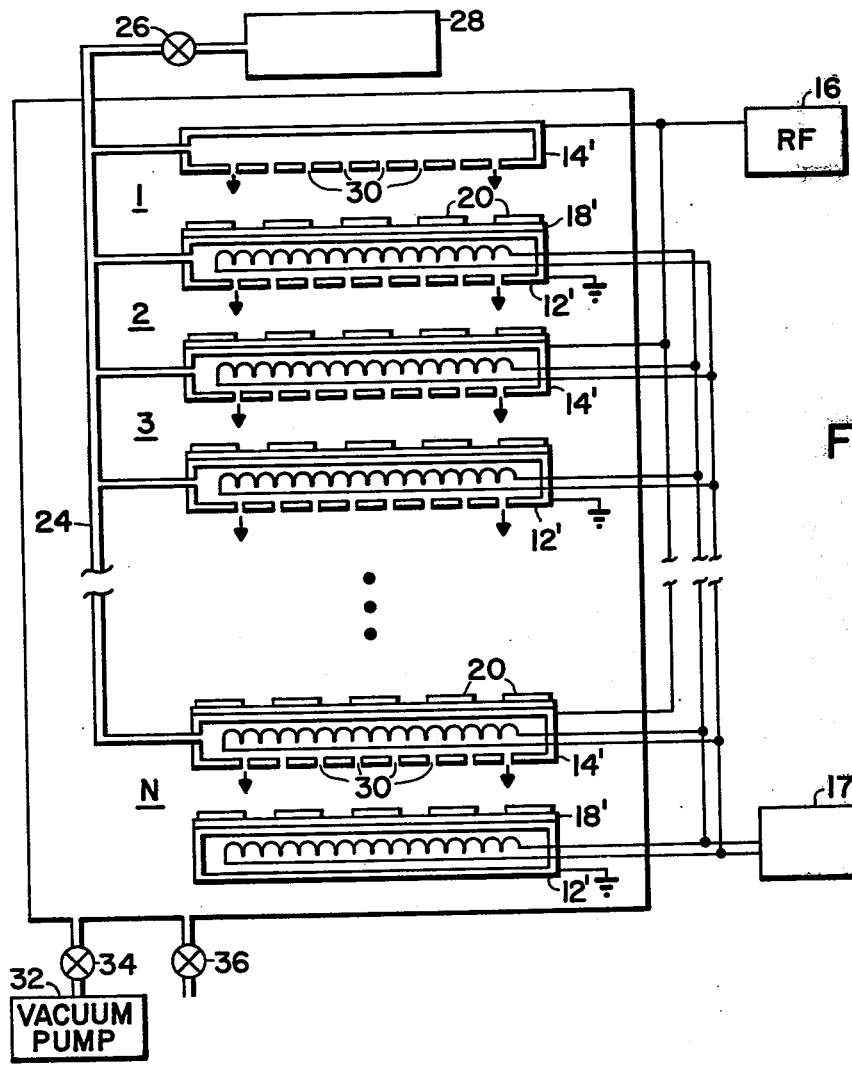
FIG. 2 is a partially schematic cross-sectional view of a second embodiment of the invention.

Because the wafers are lying flat on the holder 18, not as many wafers can be accommodated in the reactor as would be possible if the wafers were standing up in a boat. In some instances, uniformity is so important that questions of the reactor capacity are of a secondary nature. With a reactor design as depicted in FIG. 2, however, both uniformity and capacity can be achieved. In FIG. 2, a multiplicity of plates 12', 14' are arranged in enclosure 10. The plates are arranged parallel to each other and in alternating order. The plates 12' are all grounded. The plates 14' are connected to an RF source 16 so that RF fields can be established in the spaces between the alternate plates. The plates 14' could all be connected to the same source, or could, alternatively, be connected to a multiplicity of sources.

The use of a multiplicity of sources would allow each individual source to be of relatively low power, thus easing the implementation of the RF generation by means of solid state technology. With a multiplicity of sources, however, care must be taken to provide uniformity of field between sets of plates. This can be accomplished by balancing the sources with respect to one another by suitable impedance means, not specifically shown, but which are well known in the art.

In this embodiment both sets of plates 12', 14' are hollow and are connected to a source of reactant gases and both sets of plates 12', 14' are provided with a regular array of orifices 30 for the dispensing of the reactant gases. Each of the plates can be provided with temperature control elements 13' for heating or cooling the work pieces. Holders 18', containing work pieces 20, can then be placed on any of the plates 12', 14'. In this fashion, if there are N sets of plates 2N−1 times as many work pieces can be processed with the apparatus of FIG. 2 compared to the apparatus of FIG. 1.

As previously noted with respect to FIG. 1, the plates 12', 14' could themselves be the workpiece carriers without the necessity for holders 18'.

Thus it is apparent that there has been provided, in accordance with the invention, a plasma reactor that fully satisfies the objects and advantages set forth above. While the invention has been described in conjunction with specific embodiments thereof, it is evident that alternatives, modifications, and variations will be apparent to those skilled in the art in light of the foregoing description.

What is claimed is:

1. A plasma reactor having increased capacity comprising a plurality of spaced apart plates arranged in alternating sequence and adapted to receive workpieces therebetween,
    means connected to said plates to establish radio frequency fields between adjacent pairs of said plates,
    said plates being gas dispersing manifolds for uniformly dispersing reactant gases into said radio frequency fields between said plates.

2. The reactor of claim 1 wherein said plates are parallel.

3. The reactor of claim 1 wherein said plates are separated by a distance of from one-half inch to two inches.

4. The reactor of claim 1 wherein said plates are provided with temperature control elements.

5. The reactor of claim 1 wherein reactant gases are mixed in said manifold.

* * * * *